United States Patent [19]

Endres et al.

[11] 4,061,981
[45] Dec. 6, 1977

[54] VOLTAGE VARIABLE CAPACITOR TUNED RADIO RECEIVER HAVING DELAYED AUTOMATIC FREQUENCY CONTROL AT TURN-ON

[75] Inventors: Thomas E. Endres; Donald W. Rodeman, both of Kokomo, Ind.

[73] Assignee: General Motors Corporation, Detroit, Mich.

[21] Appl. No.: 715,394

[22] Filed: Aug. 18, 1976

[51] Int. Cl.² .............................................. H04B 1/26
[52] U.S. Cl. .................................. 325/419; 325/422; 325/453; 325/457; 325/490
[58] Field of Search ................................ 325/418–422, 325/452, 453, 457, 459, 462, 463, 465, 490; 334/14–16; 358/195

[56] References Cited

U.S. PATENT DOCUMENTS

| | | | |
|---|---|---|---|
| 3,631,349 | 12/1971 | Rhee | 325/422 |
| 3,753,172 | 8/1973 | Sakamoto | 325/422 |
| 3,806,817 | 4/1974 | Uchida | 325/418 |
| 3,889,193 | 10/1975 | Sasaki et al. | 325/418 |
| 3,987,399 | 10/1976 | Yokoyama | 325/422 |

Primary Examiner—Robert L. Griffin
Assistant Examiner—Jin F. Ng
Attorney, Agent, or Firm—Howard N. Conkey

[57] ABSTRACT

A voltage variable capacitor tuned radio receiver having a circuit which delays operation of a portion of the radio receiver circuit which includes the automatic frequency control circuit after the radio receiver is first energized until the filter capacitor at the output of the tuning voltage generator has charged to a selected tuning voltage to prevent the automatic frequency control circuit from locking the radio receiver onto an undesired RF carrier frequency.

3 Claims, 1 Drawing Figure

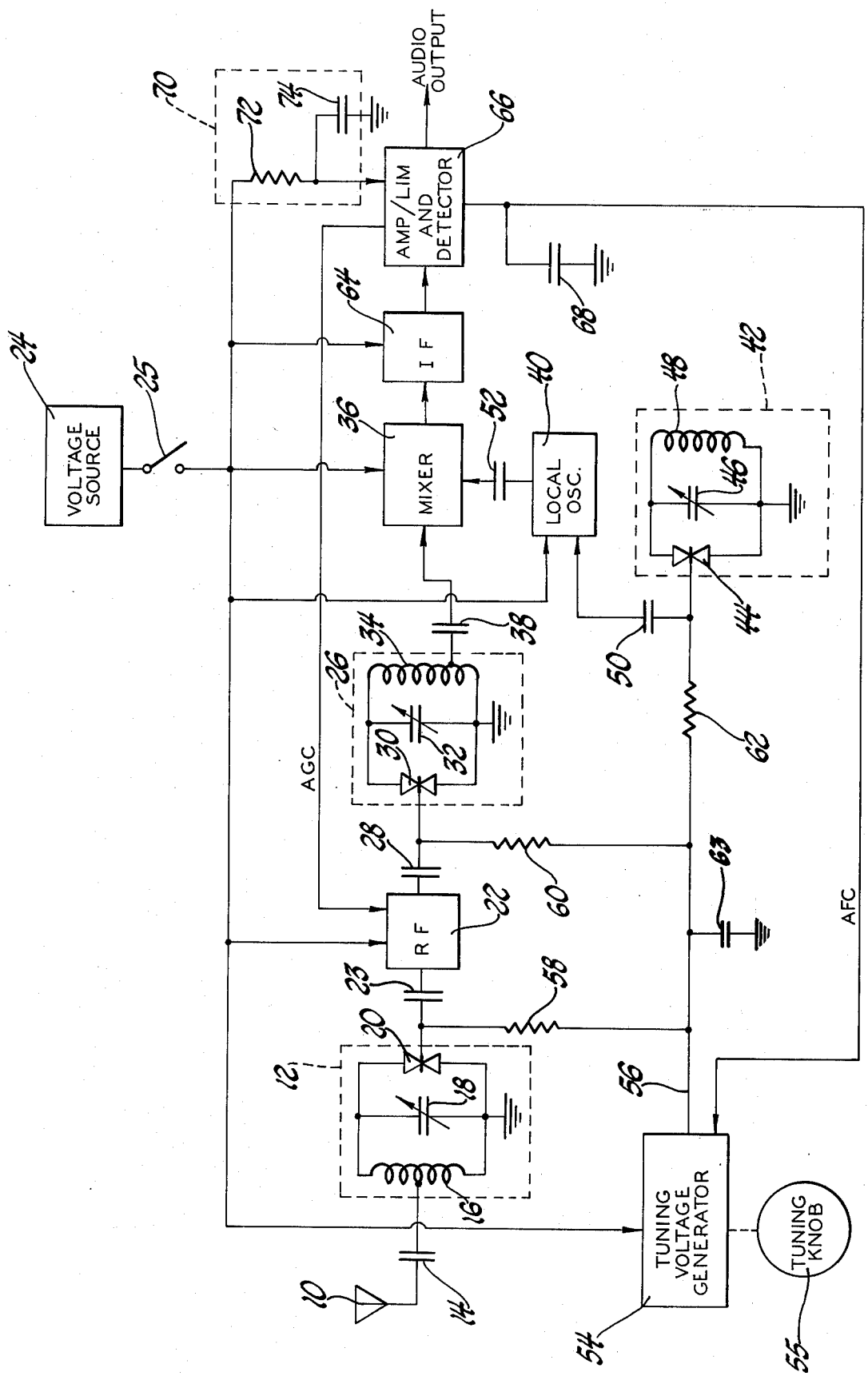

VOLTAGE VARIABLE CAPACITOR TUNED RADIO RECEIVER HAVING DELAYED AUTOMATIC FREQUENCY CONTROL AT TURN-ON

This invention relates to a radio receiver having voltage variable capacitor tuned circuits and an automatic frequency control circuit.

Voltage tuned radio receivers are generally known where the radio is tuned to a desired RF carrier frequency by applying a selected tuning voltage to voltage variable capacitors in the tunable circuits of the receiver. To prevent noise signals from effecting the tuned frequencies of the tunable circuits, the tuning voltage is applied across a large filtering capacitor. When the voltage tuned radio receivers are first energized, a delay is experienced before the radio is tuned to a selected RF carrier frequency associated with a selected tuning voltage as a result of the time constant associated with the charging of the filter capacitor. This time constant is determined by the capacitance of the filter capacitor and the output impedance of the tuning voltage generator.

When these voltage variable capacitor tuned circuits are used in conjunction with an automatic frequency control circuit, the automatic frequency control circuit may cause the radio receiver to temporarily or permanently lock onto an RF carrier frequency different from the RF carrier frequency associated with a selected tuning voltage if the automatic frequency control circuit is operable while the filter capacitor is being charged by the selected generated tuning voltage after the radio receiver is first energized. The receiver may be particularly susceptible to locking onto an undesired RF carrier signal after the receiver is first energized when a high strength RF carrier signal exists at a frequency just adjacent to the RF carrier frequency associated with a selected tuning voltage and through which the tuned frequency of the tunable circuits sweep as the filter capacitor is charged. As the tuned frequency of the tunable circuits sweeps to the selected frequency while the filter capacitor is being charged by the generated tuning voltage, the automatic frequency control circuit may operate to adjust the output of the tuning voltage generator so as to lock the tunable circuits onto the undesired RF carrier signal.

It is the general object of this invention to provide a voltage tuned radio receiver having an automatic frequency control circuit which is inhibited from locking onto an undesired RF carrier signal after the radio receiver is first energized.

It is another object of this invention to provide a circuit for disabling the automatic frequency control circuit in a radio receiver having a voltage tuned circuit and a filter capacitor across which a tuning voltage is applied while the filter capacitor is being charged to a selected tuning voltage after the radio receiver is first energized.

These and other objects of this invention may be best understood by reference to the following description of a preferred embodiment and the drawing, which is a schematic diagram of a voltage variable capacitor tuned radio receiver incorporating the principles of this invention.

Referring now to the drawing, there is illustrated an FM radio receiver which includes an antenna 10 for receiving RF signals from the surrounding medium. The RF signals received by the antenna 10 are coupled to a tunable antenna bandpass filter 12 through a coupling capacitor 14. The bandpass filter 12 includes an inductor 16, a trimmer capacitor 18 and a voltage variable capacitor 20 parallel coupled with one side of the parallel circuit grounded.

While any form of voltage variable capacitor may be employed, the voltage variable capacitor 20 is illustrated as a pair of voltage variable capacitance diodes coupled back to back with their cathodes intercoupled. The capacitance of the voltage variable capacitor 20 and the resulting tuned frequency of the bandpass filter 12 is established by a voltage applied at the common cathode.

The output of the bandpass filter 12 at the common cathode of the voltage variable capacitor 20, which is comprised of the RF carrier signals received by the antenna whose frequencies are within the bandpass of the filter 12, is coupled to an RF amplifier stage 22 through a DC blocking capacitor 23. The RF amplifier stage 22 receives operating power from a voltage source 24 through a manually operable on-off switch 25. The RF amplifier stage 22 functions to amplify the RF output of the bandpass filter 12.

The output of the RF amplifier stage 22 is coupled to a tunable RF bandpass filter 26 through a DC blocking capacitor 28. The bandpass filter 26 is comprised of a voltage variable capacitor 30, a trimmer capacitor 32 and an inductor 34 parallel coupled with one side of the parallel circuit grounded. The capacitance of the voltage variable capacitor 30 and the resulting tuned frequency of the bandpass filter 26 is established by a voltage applied at the common cathode of the voltage variable capacitor 30.

The output of the bandpass filter 26 is coupled to one input of a mixer stage 36 through a coupling capacitor 38.

A local oscillator 40 has associated therewith a tunable circuit 42. The circuit 42 is comprised of a voltage variable capacitor 44, a trimmer capacitor 46 and an inductor 48 parallel coupled with one side of the parallel circuit grounded. The common cathode of the voltage variable capacitor 44 is coupled to the local oscillator 40 through a DC blocking capacitor 50. The tunable circuit 42 functions to establish the frequency of oscillation of the local oscillator 40 whose output is coupled to a second input of the mixer stage 36 through a coupling capacitor 52. The capacitance of the voltage variable capacitor 44 and the resulting tuned frequency of the circuit 42 is established by a voltage applied to the common cathode of the voltage variable capacitor 44.

The mixer stage 36 and the local oscillator 40 each receive operating power from the voltage source 24 through the on-off switch 25.

The bandpass filter 12, the bandpass filter 26 and the tunable circuit 42 are each tuned by the output of a tuning voltage generator 54 energized by power supplied from the voltage source 24 through the receiver on-off switch 25. The tuning voltage generator is controlled by means of a tuning knob 55 which is manually operable to control the tuning voltage generator 54 to provide a selected tuning voltage on an output line 56 for tuning the tunable stages. This selected tuning voltage is supplied to the common cathode of the voltage variable capacitor 20 through a resistor 58, to the common cathode of the voltage variable capacitor 30 through a resistor 60 and to the common cathode of the voltage variable capacitor 44 through a resistor 62.

The tuning voltage output of the tuning voltage generator 54 on line 56 is also coupled across a large filter capacitor 63. The filter capacitor 63 is required so as to prevent noise signals on line 56 from effecting the capacitance of the voltage variable capacitors 20, 30 and 44 and consequently the tuned frequencies of the circuits 12, 26 and 42.

The circuit elements in the respective circuits 12, 26 and 42 are chosen such that the tuning voltage output of the tuning voltage generator 54 on line 56 controls the capacitance of the voltage variable capacitors 20 and 30 so that the bandpass filters 12 and 26 are each tuned to the same bandpass frequencies. Further, the circuit values are chosen such that the circuit 42 is tuned to a frequency which is constantly separated from the center frequency of the tuned bandpass filters 12 and 26 by a constant intermediate frequency. In the FM receiver of this embodiment, this intermediate frequency is 10.7 Mhz. Therefore, for all values of tuning voltage supplied by the tuning voltage generator 54, the local oscillator 40 supplies an alternating signal having a frequency separated from the tuned frequencies of the bandpass circuits 12 and 26 by the intermediate frequency of 10.7 Mhz.

The selected RF carrier frequency from the bandpass filter 26 is summed with the output of the local oscillator 40 by the mixer 36 which supplies a signal at the intermediate frequency to an IF amplifier stage 64 which has a relatively narrow gain versus frequency response centered about the intermediate frequency. The pass band of the IF amplifier is normally substantially narrower than the pass band of the bandpass filters 12 and 26 and therefore has substantially better frequency selectivity. The IF amplifier stage 64 receives operating power from the voltage source 24 through the on-off switch 25 and amplifies the intermediate frequency output of the mixer stage 36.

An integrated circuit, generally designated 66, includes an amplifier/limiter section and a detector section and provides an audio output, an automatic gain control (AGC) output which is coupled back to the RF amplifier 22 to control the gain thereof as a function of the amplitude of the received RF carrier signal, and an automatic frequency control (AFC) output. The AFC output in the circuit 66 of the preferred embodiment is the detected audio signal on a DC bias whose level shifts in response to shifts in the intermediate frequency above and below the desired intermediate frequency, which is 10.7 Mhz in FM radio receivers. The integrated circuit 66 may take the form of the RCA—CA3089E disclosed in linear integrated circuit application note ICAN—625.7 available from RCA Solid State Division, Box 3200, Somerville, N.J. The application note is incorporated herein by reference. The AFC signal from the circuit 66 is coupled to ground through an audio filter capacitor 68 and also to the tuning voltage generator 54. The AFC signal adjusts the tuning voltage output of the tuning voltage generator 54 in response to detected shifts in the intermediate frequency from 10.7 Mhz in a sense to maintain the intermediate frequency at 10.7 Mhz in a manner well known to those skilled in the art.

The circuit 66 is energized by the voltage source 24 through the radio receiver on-off switch 25 and a time delay circuit 70. The time delay circuit 70 includes a resistor 72 and a capacitor 74 series coupled between the radio receiver on-off switch 25 and ground. The junction between the resistor 72 and the capacitor 74 is coupled to the circuit 66 so that operating voltage for the circuit 66 comprises the voltage across the capacitor 74. The time delay circuit 70 functions to delay the application of sufficient operating voltage to the circuit 66 upon closure of the radio receiver on-off switch 25 for a time determined by the time constant of the resistor 72 and the capacitor 74. The purpose of this time delay will be apparent from the following operational description.

When the radio receiver on-off switch 25 is first closed to energize the receiver, the output of the tuning voltage generator 54 on line 56 begins to charge the filter capacitor 63 toward a selected tuning voltage magnitude determined by the position of the manually operable knob 55. This voltage across the filter capacitor 63 is coupled to the voltage variable capacitors 20, 30 and 44 which tune the circuits 12, 26 and 42 accordingly. As a result of the time constant determined by the capacitance of the filter capacitor 63 and the output impedance of the tuning voltage generator 54, the tuning voltage applied to the voltage variable capacitors 20, 30 and 44 does not instantly attain the selected tuning voltage but attains the selected tuning voltage after a time determined by the time constant associated with the filter capacitor 63. As the tuned frequency of circuits 12, 26 and 42 are swept to the respective selected frequencies, as determined by the selected tuning voltage, while the filter capacitor 63 is charged, the local oscillator signal supplied to the mixer may be summed with an RF carrier signal supplied from the bandpass filter 26 which is separated therefrom by the intermediate frequency but which is different from the selected RF carrier frequency. If the AFC portion of the circuit 66 were operative at this time, the circuit 66 would be responsive to the output of the IF amplifier 64 to supply an AFC signal to the tuning voltage generator 54 in a magnitude and sense to maintain the bandpass circuits 12 and 26 tuned to the unselected carrier frequency and the tuned circuit 42 tuned to the frequency separated from the unselected carrier frequency by the intermediate frequency. At this time, the amplifier/limiter and detector circuit 66 would supply an audio output corresponding to the audio information carried by the unselected received RF carrier.

The time delay circuit 70 is effective to inhibit the amplitude/limiter and detector circuit 66 and therefore the AFC circuit therein from controlling the output of the tuning voltage generator 54 for a time period after the on-off switch 25 is closed to energize the receiver so that the filter capacitor 63 may be charged to the selected tuning voltage from the tuning voltage 54 prior to operation of the AFC. When the capacitor 74 is charged through the resistor 72 to the voltage at which the amplifier/limited and detector circuit 66 becomes operative, the AFC signal to the tuning voltage generator 54 is then provided so as to thereafter maintain the selected tuned frequency.

The time constant of the time delay circuit 70 must be such that the circuit 66 is not enabled to operate by the voltage across the capacitor 74 until such time that the filter capacitor 63 has charged to the selected tuned voltage from the tuning voltage generator 54. In this manner, the automatic frequency control circuit is made inoperative to control the output of the tuning voltage generator 54 so as to cause the radio receiver to lock onto an RF carrier frequency different from a selected frequency.

In addition to delaying operation of AFC, inhibiting operation of the circuit 66 for the time period following the closing of the on-off switch 25 also functions to prevent the circuit 66 from supplying audio signals for the time period. This is effective to block undesirable audio signals during the charging period of the filter capacitor 63.

While the preferred embodiment delayed operation of the AFC circuit by delaying operation of the complete integrated circuit 66 which included the AFC circuit, the invention contemplates inhibiting only the AFC circuit for the time period after the radio receiver is first energized. This may be accomplished, for example, by delaying application of power to the AFC circuit only or by blocking the output of the AFC circuit for the required time period.

The description of a preferred embodiment for the purpose of illustrating the invention is not to be considered as limiting or restricting the invention, since many modifications may be made by the exercise of skill in the art without departing from the scope of the invention.

We claim:

1. A radio frequency receiver comprising: at least one tunable stage whose tuned frequency determines the receiver response to an incoming RF carrier signal, the tunable stage including a voltage variable capacitor and having a tuned frequency determined by the value of a bias voltage across the voltage variable capacitor; means effective upon energization of the receiver to supply a bias voltage across the voltage variable capacitor, the bias voltage increasing to a selected bias voltage value corresponding to a selected tuned frequency after a time delay determined by circuit parameters following initial energization of the radio receiver, the selected bias voltage value providing receiver response to a selected incoming RF carrier signal, the tuned frequency varying toward the selected tuned frequency as the bias voltage value increases to the selected bias voltage value; a frequency control circuit effective to vary the bias voltage in amount and sense tending to adjust the tuned frequency to obtain a maximum receiver response condition to an incoming RF carrier signal, the frequency control circuit tending to effect adjustment of the tuned frequency to obtain a maximum receiver response condition to an incoming RF carrier signal different from the selected RF carrier signal when the tuned frequency of the tunable stage corresponds to said different incoming RF signal while the bias voltage value increases to the selected bias voltage value; and a delay circuit effective upon energization of the receiver to inhibit operation of the frequency control circuit for a time at least equal to the time delay required for the tuning voltage to attain the selected tuning voltage value after the receiver is first energized, the frequency control circuit being rendered inoperative by the delay circuit to adjust the tuned frequency of the tunable stage to obtain maximum receiver response to an incoming RF carrier signal different from a selected RF carrier signal.

2. A radio frequency receiver comprising: at least one tunable stage whose tuned frequency determines the receiver response to an incoming RF carrier signal, the tunable stage including a voltage variable capacitor and having a tuned frequency determined by the value of a bias voltage across the voltage variable capacitor; a filter capacitor; means effective upon energization of the receiver to supply a bias voltage across the filter capacitor and the voltage variable capacitor, the filter capacitor charging to a selected bias voltage value corresponding to a selected tuned frequency after a time delay determined by circuit parameters following energization of the radio receiver and being effective to filter noise signals from the bias voltage, the selected bias voltage value providing receiver response to a selected incoming RF carrier signal, the tuned frequency varying toward the selected tuned frequency as the filter capacitor charges to the selected bias voltage value; a frequency control circuit effective to vary the bias voltage in amount and sense tending to adjust the tuned frequency to obtain a maximum receiver response condition to an incoming RF carrier signal, the frequency control circuit tending to effect adjustment of the tuned frequency to obtain a maximum receiver response condition to an incoming RF carrier signal different from the selected RF carrier signal when the tuned frequency of the tunable stage corresponds to said different incoming RF signal while the filter capacitor charges to the selected bias voltage value; and a delay circuit effective upon energization of the receiver to inhibit operation of the frequency control circuit for a time at least equal to the filter capacitor charging time delay, the frequency control circuit being rendered inoperative by the delay circuit to adjust the tuned frequency of the tunable stage to obtain maximum receiver response to an incoming RF carrier signal different from a selected RF carrier signal.

3. A radio frequency receiver comprising: at least one tunable stage whose tuned frequency determines the receiver response to an incoming RF carrier signal, the tunable stage including a voltage variable capacitor and having a tuned frequency determined by the value of a bias voltage across the voltage variable capacitor; a filter capacitor; means effective upon energization of the receiver to supply a bias voltage across the filter capacitor and the voltage variable capacitor, the filter capacitor charging to a selected bias voltage value corresponding to a selected tuned frequency after a first time delay determined by circuit parameters following energization of the radio receiver and being selective to filter noise signals from the bias voltage value, the selected bias voltage value providing receiver response to a selected incoming RF carrier signal, the tuned frequency varying toward the selected tuned frequency as the filter capacitor charges to the bias voltage value; a frequency control circuit effective when energized by a predetermined voltage value to vary the bias voltage in amount and sense tending to adjust the tuned frequency to obtain a maximum receiver response condition to an incoming RF carrier signal, the frequency control circuit tending to effect adjustment of the tuned frequency to obtain a maximum receiver response condition to an incoming RF carrier signal different from the selected RF carrier signal when the tuned frequency of the tunable stage corresponds to said different incoming RF signal while the filter capacitor charges to the bias voltage; means effective to energize the radio receiver, said means including a voltage source and a manually operable switch means series coupled therewith, the switch means being operable to energize the radio frequency receiver; a time delay circuit parallel coupled across the series coupled voltage source and switch means, the time delay circuit including a time delay capacitor and a resistor, the time delay capacitor being charged by the voltage source through the resistor upon operation of the switch means; means effective to couple the voltage charge across the time delay capacitor to the frequency control circuit to effect energization thereof when said voltage charge attains the predetermined voltage value, the time delay capacitor and resistor defining a time constant so that the voltage charge attains the predetermined voltage value a second time delay after operation of the switch means, the second time delay being at least equal to the first time delay, the frequency control circuit being rendered inoperative by the time delay circuit to adjust the tuned frequency of the tunable stage to obtain maximum receiver response to an incoming RF carrier signal different from a selected RF carrier signal.

* * * * *